(12) United States Patent
Yang

(10) Patent No.: US 10,020,064 B2
(45) Date of Patent: Jul. 10, 2018

(54) DYNAMIC REFERENCE CURRENT SENSING USING MULTIPLE REFERENCE CELLS

(71) Applicant: TAIWAN SEMICONDUCTOR MANUFACTURING COMPANY, LTD., Hsinchu (TW)

(72) Inventor: Tien-Chun Yang, San Jose, CA (US)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 15/587,039

(22) Filed: May 4, 2017

(65) Prior Publication Data

US 2017/0236594 A1 Aug. 17, 2017

Related U.S. Application Data

(63) Continuation of application No. 14/024,109, filed on Sep. 11, 2013, now Pat. No. 9,666,246.

(51) Int. Cl.
*G11C 16/28* (2006.01)
*G11C 16/30* (2006.01)

(52) U.S. Cl.
CPC .............. *G11C 16/28* (2013.01); *G11C 16/30* (2013.01)

(58) Field of Classification Search
CPC ..... G11C 11/1673; G11C 7/14; G11C 16/349; G11C 11/5642; G11C 29/028; G11C 29/021; G11C 16/28; G11C 7/062; G11C 7/065; G11C 5/02; H03K 5/2472

See application file for complete search history.

(56) References Cited

U.S. PATENT DOCUMENTS

| | | | |
|---|---|---|---|
| 5,886,546 | A | 3/1999 | Hwang |
| 6,466,059 | B1 | 10/2002 | Gaibotti |
| 2006/0023531 | A1 | 2/2006 | Crippa |
| 2006/0126374 | A1 | 6/2006 | Waller et al. |
| 2007/0030729 | A1 | 2/2007 | Chan |
| 2008/0002481 | A1 | 1/2008 | Gogl et al. |
| 2009/0273998 | A1 | 11/2009 | Mu et al. |
| 2013/0070519 | A1 | 3/2013 | Lin et al. |

*Primary Examiner* — Ajay Ojha
(74) *Attorney, Agent, or Firm* — Hauptman Ham, LLP

(57) ABSTRACT

A circuit includes a current generating circuit and a sense amplifier. The current generating circuit includes a first current mirror that generates a first current having a first current value less than a value of a first cell current through a first reference cell, and based on a ratio of the first cell current to the first current. A second current mirror generates a second current having a second current value less than a value of a second cell current through a second reference cell, and based on a ratio of the second cell current to the second current. The current generating circuit generates a reference current having a reference current value based on the first and second current values. The sense amplifier receives a third current having a third current value and generates a voltage output based on the reference and third current values.

20 Claims, 5 Drawing Sheets

US 10,020,064 B2

DYNAMIC REFERENCE CURRENT SENSING USING MULTIPLE REFERENCE CELLS

PRIORITY CLAIM

The present application is a continuation of U.S. application Ser. No. 14/024,109, filed Sep. 11, 2013, which is incorporated herein by reference in its entirety.

FIELD

The present disclosure is related to sensing data based on a dynamic reference current.

BACKGROUND

In an approach, a fixed value of a reference current is used in sensing data for a metal-oxide nitride-oxide semiconductor (MONOS) flash memory cells. For illustration, a flash memory cell is called a flash cell, a memory cell, etc. Further, a sense amplifier compares the value of the flash cell current with the value of the reference current. If the value of the cell current is higher than that of the reference current, the data stored in the flash cell is logically high. But if the value of the cell current is lower than that of the reference current, the data stored in the flash cell is logically low. After the flash cell is programmed and erased many times, such as over about 10,000 times, the flash cell experiences a charge loss. As a result, the cell current decreases. In contrast, the fixed value of the reference current stays the same. Consequently, the data revealed by the sense amplifier could be inaccurate.

BRIEF DESCRIPTION OF THE DRAWINGS

The details of one or more embodiments of the disclosure are set forth in the accompanying drawings and the description below. Other features and advantages will be apparent from the description, drawings, and claims.

Like reference symbols in the various drawings indicate like elements.

DETAILED DESCRIPTION

Figure 1:
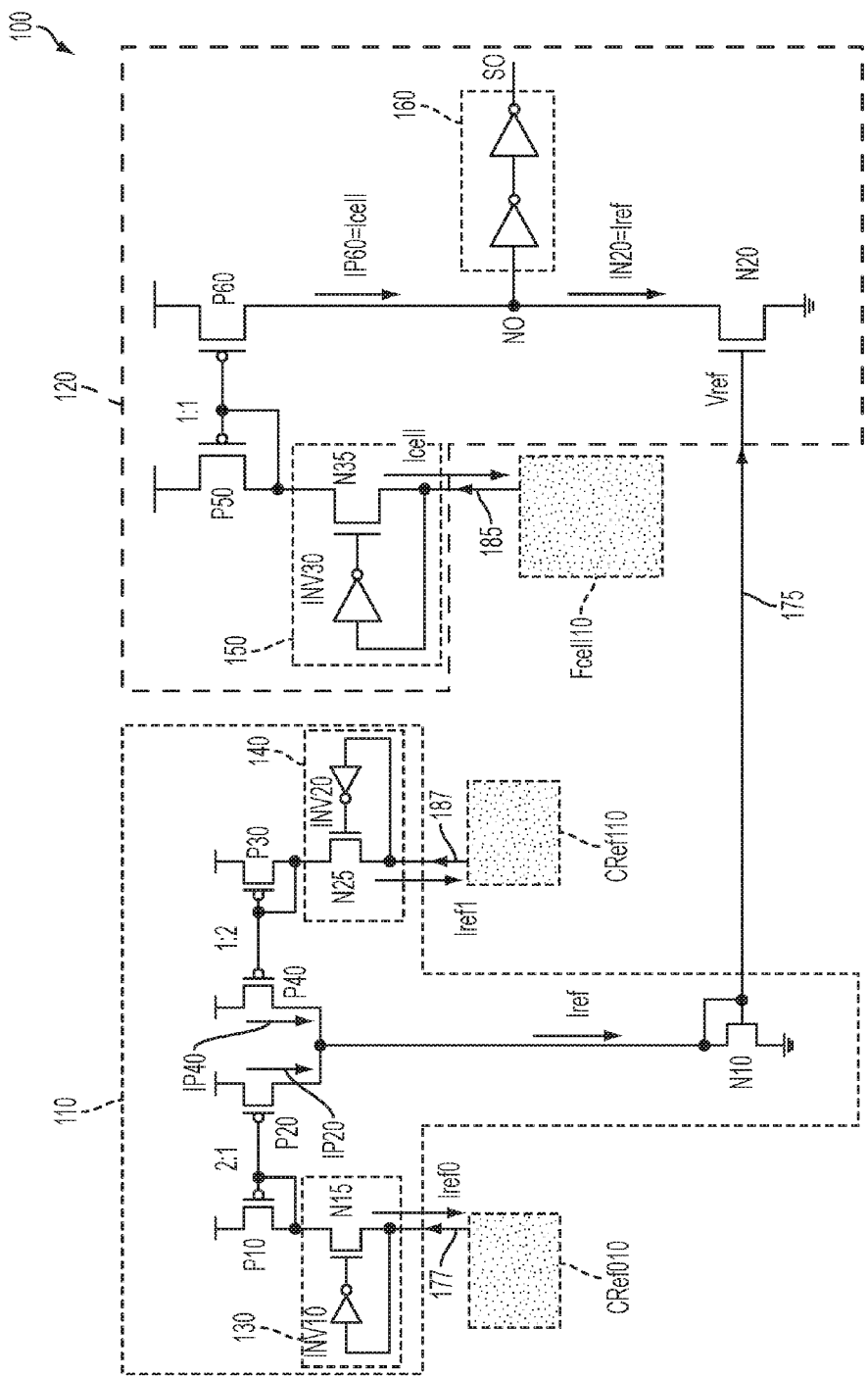
FIG. 1 is a diagram of a circuit used to illustrate dynamic current sensing, in accordance with some embodiments.

Embodiments, or examples, illustrated in the drawings are disclosed below using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art.

Some embodiments have one or a combination of the following features and/or advantages. In some embodiments, data sensing is based on a dynamic reference current. The reference current is dynamic because it varies as the current in a corresponding flash memory cell varies. As a result, the sense or read margin increases.

FIG. 1 is a diagram of a circuit 100, in accordance with some embodiments. Circuit 100 is used to illustrate operations of a sense amplifier 120, which senses a current Icell of a flash memory cell Fcell10 based on a reference current Iref generated by a reference current generating circuit 110.

Flash Memory Cell

In some embodiments, flash memory cell Fcell10 is manufactured based on metal-oxide nitride-oxide semiconductor (MONOS) technology. After Fcell10 is manufactured, Fcell10 stores a "neutral" logical value, which is not a low logical nor a high logical value. So that Fcell10 stores a low logical value, electrons are injected into the source side of flash cell Fcell10. In other words, injecting electrons into Fcell10 programs Fcell10 with a low logical value. So that Fcell10 stores a high logical value, Fcell10 is programmed with a low logical value, and the low logical value is then erased to result in a high logical value.

When Fcell10 is accessed, Fcell10 draws a current Icell. A value of Icell depends on a logical value stored in Fcell10. For example, if Fcell10 stores a low logical value, Icell is relatively low, compared with reference current Iref. In contrast, if current Fcell10 stores a high logical value, Icell is relatively high compared with Iref. In some embodiments, sense amplifier 120 compares a value of Icell with a value of Iref. If the value of Icell is less than the value of Iref, Fcell10 stores a low logical value. But if the value of Icell is greater than the value of Iref, Fcell10 stores a high logical value.

Figure 4:
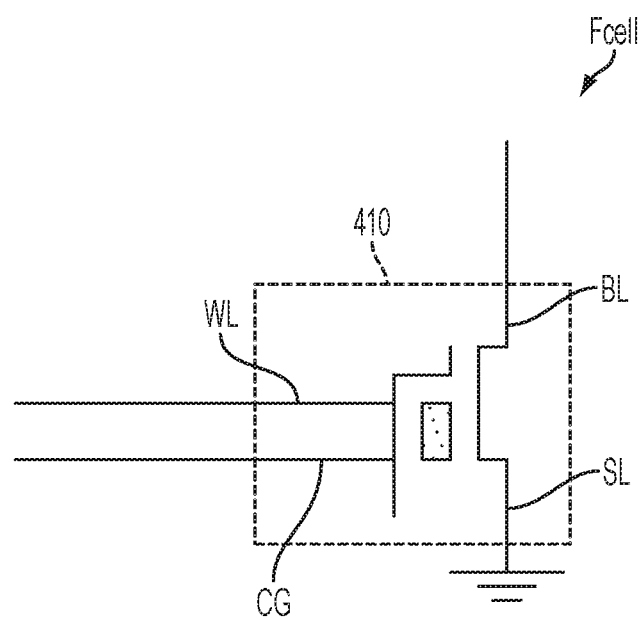
FIG. 4 is a circuit diagram of a flash memory cell of the memory array in FIG. 2, in accordance with some embodiments.

A line 185 corresponds to bit line BL in FIG. 4. Details of flash memory cells are explained with reference to FIG. 4.

Reference Current Generating Circuit

Current generating circuit 110 generates current Iref based on a current Iref0 and a current Irfef1.

A reference cell CRef010 generates a current Iref0 corresponding to current Icell when Fcell stores a low logical value. In some embodiments, reference cell CRef010 includes a flash cell Fcell in FIG. 4 programmed to store a low logical value. A line 177 corresponds to bit line BL in FIG. 4.

A stabilization circuit 130 including an inverter INV10 and a transistor N15 stabilizes current Iref0. In some embodiments, inverter INV10 includes a PMOS transistor (not shown) and an NMOS transistor (not shown). A size in terms of a width W and length L ratio of transistor N15 is selected such that a voltage at the gate and at the source of transistor N15 is at a specific value. As a result, a voltage drop across the gate and the source of transistor N15 is stabilized. A current through transistor N15 or current Iref0 is therefore stabilized.

A PMOS transistor P10 and a PMOS transistor P20 generate a current IP20 having half a value of current Iref0. Current IP20 is a current provided by transistor P20. Current Iref0 has the same value as a current drawn by PMOS transistor P10. For illustration, PMOS transistor P10 and PMOS transistor P20 are configured as a current mirror having a ratio 2:1. As a result, IP20=½ IRef0. In some embodiments, to select a 2:1 ratio, a size of PMOS transistor P20 is designed to be about ½ that of PMOS transistor P10.

A reference cell CRef110 generates a current Iref1 corresponding to current Icell of Fcell10 when Fcell10 stores a high logical value. In some embodiments, reference cell CRef110 includes a flash cell Fcell in FIG. 4 programmed to store a high logical value. A line 187 corresponds to bit line BL in FIG. 4.

A stabilization circuit 140 with reference to current Iref1 corresponds to stabilization circuit 130 with reference to current Iref0. For example, stabilization circuit 140 stabilizes current Iref1. Stabilization circuits 130 and 140 are shown in current generating circuit 110 for illustration. Embodiments of the disclosure are not limited to a location of stabilization circuit 130 or 140. For example, at least one of stabilization circuit 130 or 140 is not part of current generating circuit 110. Further, in some embodiments, at least one of stabilization circuit 130 or 140 is not used.

A PMOS transistor P30 and a PMOS transistor P40 with reference to current Iref1 correspond to PMOS transistors P10 and P20 with reference to current Iref1, respectively. For example, PMOS transistors P30 and P40 generate a current IP40 having half a value of current Iref1. In some embodiments, PMOS transistor P30 and PMOS transistor P40 are configured as a current mirror having a ratio 2:1. As a result, IP40=½ IRef1. In some embodiments, to select a 2:1 ratio, a size of PMOS transistor P40 is designed to be about ½ that of PMOS transistor P30.

Current Iref is the sum of currents IP20 and IP40. Mathematically expressed:

$$Iref = IP20 + IP40$$
$$= 1/2 \; IRef0 + 1/2 \; IRef1$$
$$= 1/2 \; (IRef0 + IRef1)$$

Current Iref is thus an average of current Icell when Fcell stores a high and a low logical value. Expressed in another way, current Iref is at the middle point of current Iref0 and current Iref1.

An NMOS transistor N10 of circuit 110 and an NMOS transistor N20 of sense amplifier 120 function as a current mirror so that a current IN20 is equal to current Iref. Current IN20 is a current drawn by NMOS transistor N20. Explained in a different way, NMOS transistor N10 converts current Iref to a voltage Vref on a line 175 provided to a gate of transistor N20. In some embodiments, voltage Vref is provided to a plurality of transistors N20 of corresponding sense amplifiers 120 to sense a plurality of corresponding memory cells Fcells. For example, voltage Vref is provided to 16 transistors N20 of corresponding 16 amplifiers 120 as illustrated with reference to FIG. 2. In such a condition, a pair of reference cells CRef010 and CRef110 functions with 16 sense amplifiers 120 and 16 memory cells Fcell in FIG. 4.

Sense Amplifier Circuit

A stabilization circuit 150 of sense amplifier 120 stabilizes current Icell in the same manner as stabilization circuit 130 stabilizing current Iref0. Inverter INV30 and NMOS transistor N35 correspond to inverter INV10 and NMOS transistor N15, respectively. Stabilization circuit 150 is shown in sense amplifier 120 for illustration. Embodiments of the disclosure are not limited to a location of stabilization circuit 150. For example, stabilization circuit 150 is not part of sense amplifier 120. Further, in some embodiments, stabilization circuit 150 is not used.

A PMOS transistor P50 and a PMOS transistor P60 mirror current Icell such that a current IP60 equals to current Icell. Current IP60 is a current drawn by PMOS transistor P60.

A node NO receives current IP60 and current IN20. When current IP60 is greater than current IN20, a voltage at node NO increases such that an output circuit 160 generates an output SO having a high logical value. When current IP60 is less than current IN20, however, a voltage at node NO decreases such that output circuit 160 generates output SO having a low logical value. Because current IP60 equals current Icell and current IN20 equals current Iref, effectively, when current Icell is greater than current Iref, output SO is logically high. But when current Icell is less than current Iref, output SO is logically low.

Various embodiments of the present disclosure are advantageous over other approaches. For example, both reference cells CRef010 and CRef110 each includes a flash cell Fcell in FIG. 4. In operation, when flash cell Fcell10 is erased, reference cells CRef010 and CRef110 are also erased. As a result, when characteristics of Fcell10 change, characteristics of reference cells CRef010 and CRef110 change in a similar manner. Further, because reference current Iref is an average of currents Iref0 and Iref1, reference current Iref is consistently greater than current Iref0 and lesser than current Iref1 regardless of whether current Iref0 and/or current Iref1 changes. Consequently, if a value of cell current Icell changes due to a charge loss of repeated usages over the years, reference current Iref changes accordingly. In other words, a change in the value of current Icell is compensated by a change in the value of current Iref. As a result, a result of comparison by sense amplifier 120 between reference current Iref and cell current Iref reveals appropriate data.

In the above illustration, a value of current Iref is an average of currents Iref0 and Iref1. Expressed differently, current Iref is at the middle point of current Icell when Fcell stores a low and a high logical value. Different values of current Iref are within the scope of the present disclosure. The values of current Iref are adjusted by adjusting the size of transistors P10, P20, P30, and/or P40. Effectively, the size ratio between transistors P10 and P20 and/or between transistors P30 and P40 change accordingly. For example, based on a ratio 3:1, IP20=⅓ IP10=⅓ Iref0, and IP40=⅓ IP30=⅓ Iref1. As a result, Iref=IP20+IP40=⅓ (Iref0+Iref1). In some embodiments, based on a predetermined value of current Iref, the size ratio between transistor P10 and P20 and/or between transistor P30 and P40 is determined accordingly. In other words, the sizes of transistors P10, P20, P30, and P40 are determined accordingly to provide the predetermined current Iref.

Because current Iref is an average of current Iref0 and Iref1, current Iref changes as current Iref0 and/or current Iref1 changes. As a result, current Iref is a dynamic current, and sensing the data of Fcell10 based on current Iref is called dynamic current sensing.

Memory Array

Figure 2:
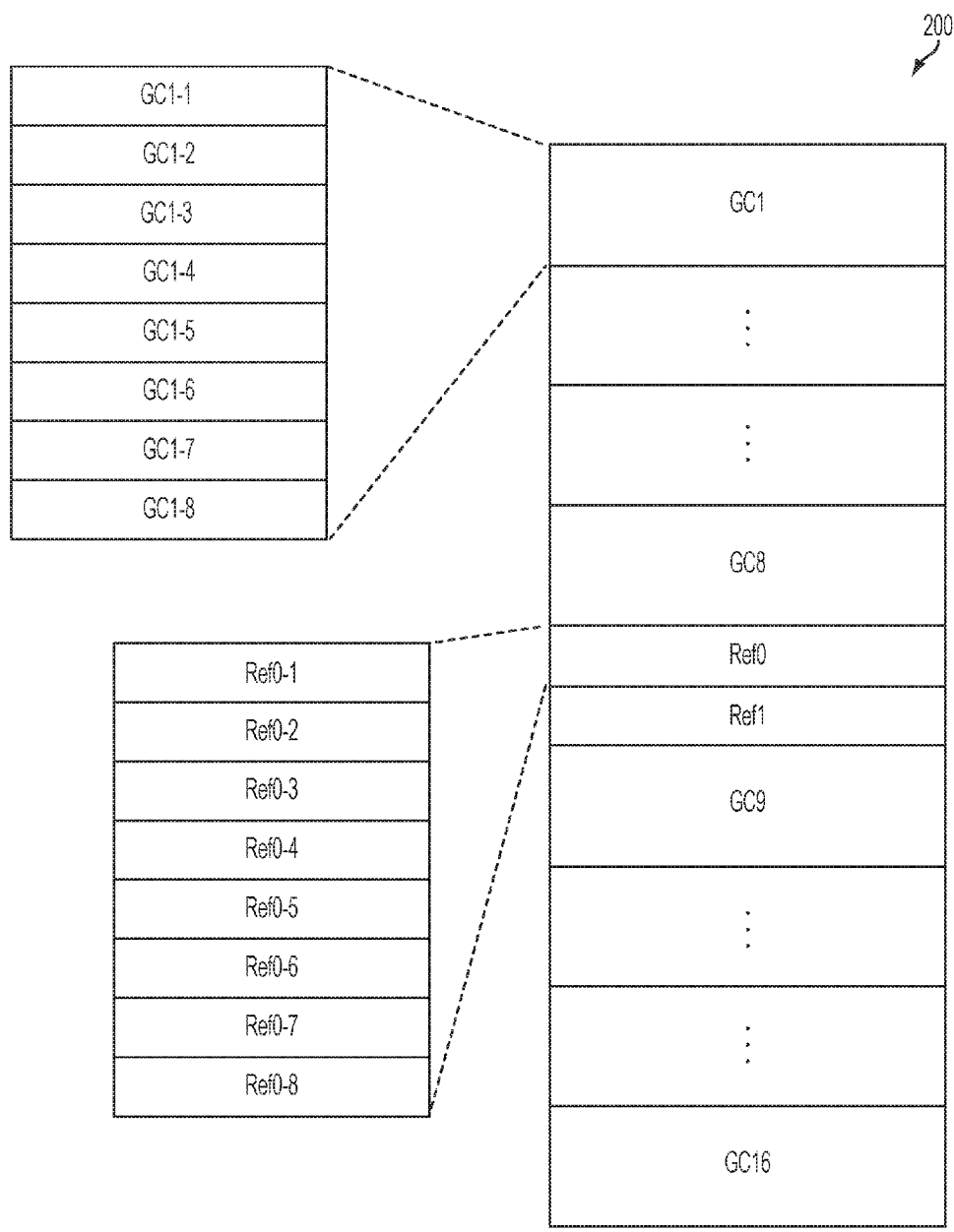
FIG. 2 is a block diagram of a memory array that uses the dynamic current sensing mechanism in FIG. 1, in accordance with some embodiments.

FIG. 2 is a block diagram of a memory array 200, in accordance with some embodiments. Memory array 200 uses the dynamic current sensing mechanism illustrated in FIG. 1. Memory array 200 includes column segments GC1 to GC16, and current reference segments Ref0 and Ref1.

With reference to column segments GC1 to GC16, for simplicity, details of only segment GC1 are shown, but are also applicable to segments GC2 to GC16. In some embodiments, segment GC1 includes 64 columns divided into 8 (sub) segments GC1-1 to GC1-8. Further, each segments GC1-1 to GC1-8 includes 8 columns (not shown).

Also for simplicity, details of reference current segment Ref0 are shown, but are also applicable to current reference segment Ref1. In some embodiments, segment Ref0 includes 8 columns Ref0-1 to Ref0-8. Similarly, segment Ref1 also includes 8 columns Ref1-1 to Ref1-8 (not shown).

In some embodiments, in operation, one column in each of a corresponding segment GC1 to GC16 is active at a time and functions with a corresponding pair of columns of corresponding current reference segments Ref0 and Ref1. Effectively, 16 columns from 16 segments GC1 to GC16 function with a pair of columns of segments Ref0 and Ref1. For example, one column in segment Ref0 and one column in segment Ref1 operate as a pair and function with a corresponding segment GC1-1 to GC1-8 of segment GC1, a corresponding segment GC2-1 to GC2-8 (not shown) of segment GC2, a corresponding segment GC3-1 to GC3-8 (not shown) of segment GC3, etc., for a total of 16 columns of segments GC1 to GC16. For simplicity of discussion, one column in a segment is described, but the description is applicable to the other 15 columns. For example, a pair comprising columns Ref0-1 and Ref1-1 function with segment GC1-1 of GC1. A pair comprising columns Ref0-2 and Ref1-2 function with segment GC1-2 of GC1, and a pair comprising columns Ref0-3 and Ref1-3 function with segment GC1-3 of GC1, etc.

For another example, when any one of 8 columns in segment GC1-1 is active, a corresponding pair of Ref0-1 and Ref1-1 is selected to function with the active column in segment GC1-1. For another example, when any one of 8 columns in segment GC1-2 is active, a corresponding pair of Ref0-2 and Ref1-2 is selected to function with the active column in segment GC1-2, and when any one of 8 columns in segment GC1-3 is active, a corresponding pair of Ref0-3 and Ref1-3 is selected to function with the active column in segment GC1-3, etc.

Memory Array and Sense Amplifier Circuit

Figure 3:
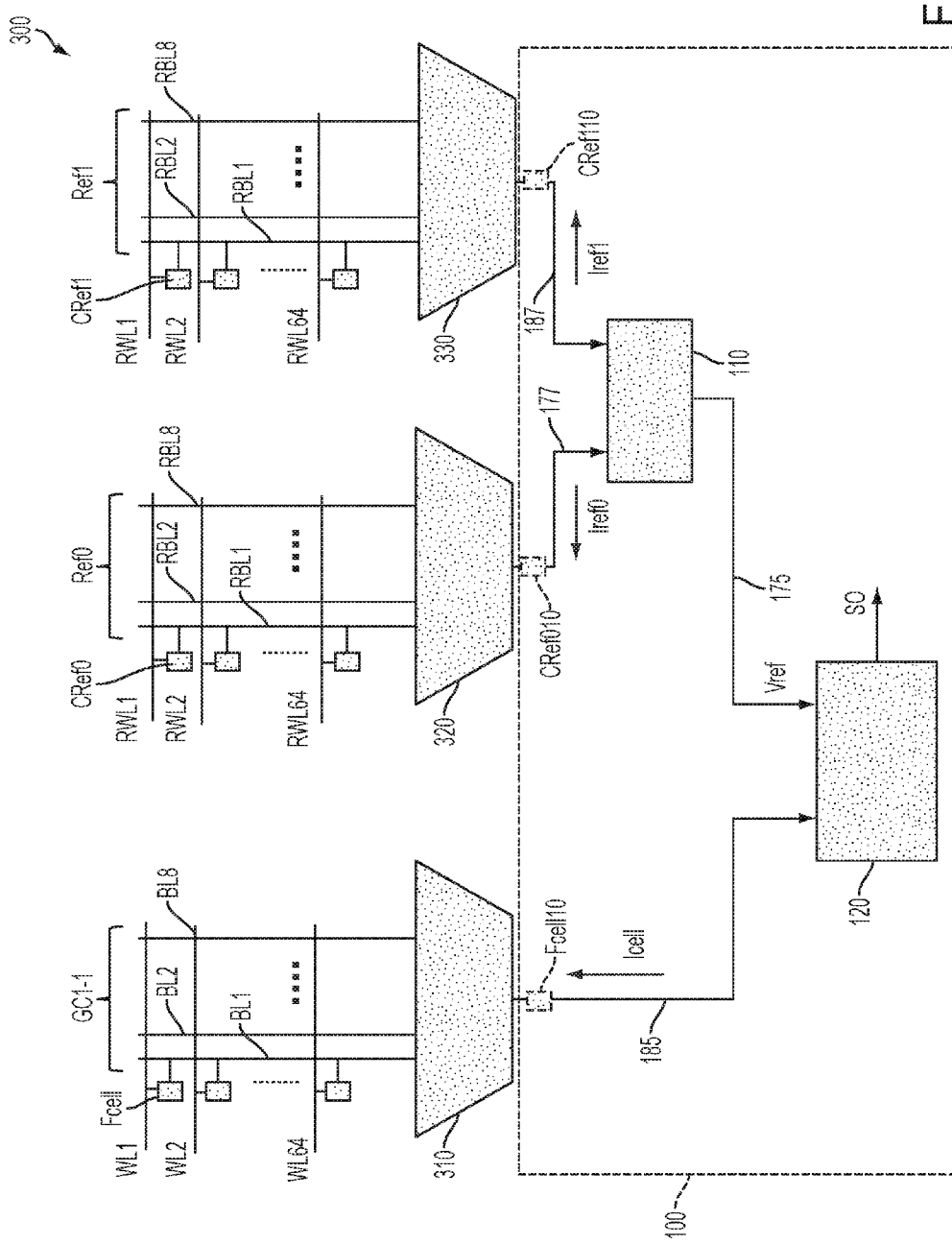
FIG. 3 is a diagram of a circuit illustrating how the circuit in FIG. 1 is used with the memory array in FIG. 2, in accordance with some embodiments.

FIG. 3 is a diagram of a circuit 300, in accordance with some embodiments. Circuit 300 is used to illustrate how circuit 100 in FIG. 1 is used in conjunction with memory array 200 in FIG. 2. For illustration, segment GC1-1 of segment GC1 of memory array 200 is used with segments Ref0 and Ref1, and is shown. Segments GC1-2 to GC1-8 of GC1 used with segments Ref0 and Ref1 are in a manner similar to segment GC1-1 being used with segments Ref0 and Ref1. In some embodiments, segments GC1-2 to GC1-8 of segment GC1 are also input into a multiplexer 310 as segment GC1-1. Effectively, 8 segments GC1-1 to GC1-8 of segments GC1 are input into multiplexer 310. Segments GC1-2 to GC1-8 are used with segments Ref0 and Ref1 in a manner similar to segment GC1-1 being used with segments Ref0 and Ref1. Segments GC2 to GC16 used with segments Ref0 and Ref1 are in a similar manner as segment GC1 being used with segments Ref0 and Ref1. Effectively, in some embodiments, 16 multiplexers 310 correspond to 16 segments GC1 to GC16.

Segment GC1-1 includes 8 columns each corresponding to a bit line BL in FIG. 4. As illustratively shown, segment GC1-1 includes 8 bit line BL1 to BL8. In some embodiments, each bit line BL1 to BL8 is coupled with 64 flash memory cells Fcell. For simplicity, flash memory cells Fcell coupled with bit line BL1 are shown, and one memory cell Fcell of bit line BL1 is labeled.

Effectively, in the illustration of FIG. 3, the flash memory cells coupled with bit lines BL1 to BL8 form an array having 8 columns and 64 rows. Flash memory cells in a row are coupled with a word line WL in FIG. 4. As illustratively shown, 64 rows of GC1-1 correspond to 64 word lines WL1 to WL64.

Similarly, segment Ref0 includes 8 bit line RBL1 to RBL8. In some embodiments, each bit line RBL1 to RBL8 of segment Ref0 is also coupled with 64 reference cells CRef0. For simplicity, reference cells of bit line RBL1 of section Ref0 are shown, and one reference cell CRef0 is labeled. In some embodiments, a reference cell CRef0 includes a flash memory cell Fcell programmed with a low logical value. Effectively, the reference cells CRef0 coupled with bit lines RBL1 to RBL8 of segment Ref0 form an array with 8 columns and 64 rows. Reference cells in a row of section Ref0 are coupled with a word line of section Ref0. As illustratively shown, 64 rows in segment Ref0 correspond to 64 word lines RWL1 to RWL64.

Segment Ref1 also includes 8 bit lines RBL1 to RBL1. Each bit line RBL1 to RBL8 of Ref1 is coupled with 64 reference cells CRef1. For simplicity, reference cells coupled with bit line RBL1 of segment Ref1 are shown, and one reference cell CRef1 is labeled. In some embodiments, a reference cell CRef1 includes a flash memory cell Fcell programmed with a high logical value. Effectively, the reference cells CRef1 coupled with bit line RBL1 to RBL8 of segment Ref1 form an array with 8 columns and 64 rows. Reference cells CRef1 in a row of section Ref1 are coupled with a word line of section Ref1. As illustratively shown, 64 rows in segment Ref1 correspond to 64 word lines RWL1 to RWL64. Because each of word lines RWL1 to RWL64 also controls a row of reference cells CRef0, each of word lines RWL1 to RWL64 controls the same row of Ref0 and Ref1.

In FIG. 3, 64 rows in segment GC1-1 and segments Ref0, Ref1 are used for illustration. A different number of rows is within the scope of the present disclosure.

In operation, a multiplexer 310 selects a memory cell Fcell in a column and a row of segment GC1-1 to be sensed. For illustration, multiplexer 310 selects memory cell Fcell10 represented by a dashed box that is coupled with word line WL1 and bit line BL1 of segment GC-1.

A multiplexer 320 selects a reference cell CRef0 in a column and a row of segment Ref0 to be used in sensing the selected memory cell Fcell10. For illustration, multiplexer 320 selects reference cell CRef010 represented by a dashed box that is coupled with word line RWL1 and bit line RBL1 of segment Ref0.

In some embodiments, the column of the selected reference cell CRef010 corresponds to the selected column of the selected memory cell Fcell10. For example, because the selected memory cell Fcell10 is coupled with bit lint BL1 of segment GC1-1, the selected reference cell CRef010 is also coupled with bit line RBL1 of segment Ref0. But if the selected memory cell Fcell10 is coupled with another bit line of segment GC1-1, such as bit line BLi where i is an integer number, the selected reference cell CRef010 is also coupled with a corresponding read bit line RBLi of segment Ref0.

A multiplexer 330 selects a reference cell CRef1 in a column and a row of segment Ref1 to be used with the selected reference cell CRef010 to sense the selected memory cell Fcell10. For illustration, multiplexer 330 selects reference cell Cref110 represented by a dashed box. Further, because the selected memory cell Fcell10 and reference cell CRef010 are coupled with corresponding bit lines BL1 and RBL1, in some embodiments, the selected reference cell CRef110 is also coupled with corresponding read bit line RBL1 of section Ref1.

As illustratively shown in FIG. 3, memory cell Fcell10, reference cell CRef010, reference cell CRef110, current generating circuit 110, and sense amplifier 120 constitute circuit 100 in FIG. 1.

Multiplexers 310, 320, and 330 are used for illustration. Other ways to identify a corresponding flash memory cell Fcell, reference cell CRef010, or CRef100 are within the scope of various embodiments. For example, in some embodiments, a flash memory cell, a reference cell CRef010, or CRef110 is identified by a decoder based on corresponding address of the corresponding cell.

Flash Memory Cell, Circuit Diagram

FIG. 4 is a circuit diagram of a flash memory cell Fcell, in accordance with some embodiments. Memory cell Fcell includes a transistor 410 having four terminals serving as a bit line BL, a source line SL, a word line WL, and a control gate CG. Memory cell Fcell has a split gate region in which a first half of the gate region is coupled with word line WL and a second half of the gate region is coupled with control gate CG. When both word line WL and control gate CG are activated, for example with a high logical value, memory cell Fcell is activated. Source line SL is grounded.

In some embodiments, memory cell Fcell is programmed with a low logical value to generate reference cell CRef010, or is programmed with a high logical value to generate reference cell CRef110. In such a situation, word line WL corresponds to one of word line RWL1 to RWL64 in FIG. 3, and bit line BL corresponds to one of bit line RBL1 to RBL8.

Flash memory cell Fcell in FIG. 4 is used for illustration. Other memory cells and/or other configurations of flash memory cells are within the contemplated scope of the present disclosure.

Method

Figure 5:
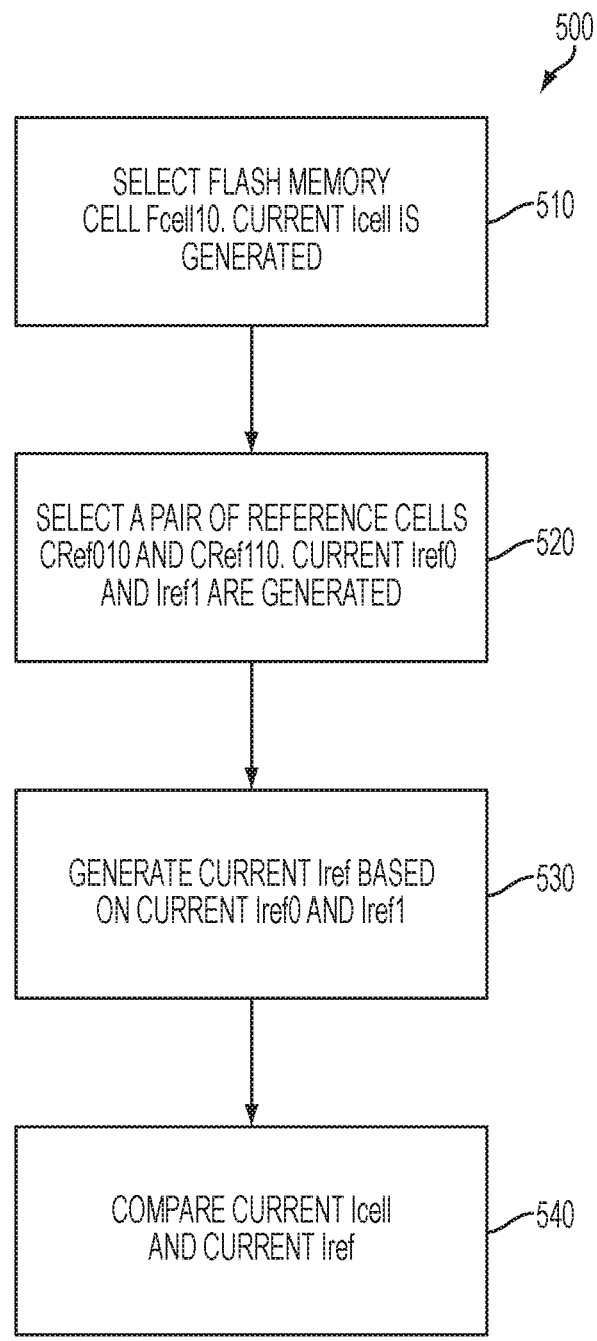
FIG. 5 is a flow chart of a method illustrating operations of the circuit in FIG. 3, in accordance with some embodiments.

FIG. 5 is a flowchart of a method 500, in accordance with some embodiments. Method 500 is used to illustrate operations of circuit 300 in FIG. 3.

In operation 510, flash memory cell Fcell10 is selected to be sensed. In some embodiments, a word line and a bit line corresponding flash memory cell Fcell10 are activated, and multiplexer 310 selects flash memory cell Fcell10.

In operation 520, a pair of reference cells CRef010 and CRef110 is selected to be used in sensing the selected memory cell Fcell10. In some embodiments, a word line and a bit line corresponding to reference cell CRef010 are activated, and multiplexer 320 selects reference cell CRef010. Further, a word line and a bit line corresponding to reference cell CRef110 are activated, and multiplexer 330 selects reference cell CRef110.

In operation 530, current generating circuit 100 in FIG. 1, based on reference cells CRef010 and CRef110, generates current Iref and voltage Vref for use by sense amplifier 120.

In operation 540, sense amplifier 120, based on current Icell generated by flash memory cell Fcell10 and reference current Iref, generates output SO. The logical value on output SO indicates a corresponding logical value stored in flash memory cell Fcell10.

In some embodiments, a circuit includes a current generating circuit. The current generating circuit includes a first current mirror configured to generate a first current having a first current value, the first current value being less than a value of a first cell current through a first reference cell and being based on a first ratio of the first cell current to the first current, and a second current mirror configured to generate a second current having a second current value, the second current value being less than a value of a second cell current through a second reference cell and based on a second ratio of the second cell current to the second current. The current generating circuit is configured to generate a reference current having a reference current value based on the first current value and the second current value. The circuit also includes a sense amplifier configured to receive a third current having a third current value and generate a voltage output based on the reference current value and the third current value.

In some embodiments, a method includes providing a first cell current from a first reference cell to a first current mirror, providing a second cell current from a second reference cell to a second current mirror, and generating a third cell current with a memory cell. The method also includes generating, with the first current mirror, a first current having a first current value, the first current value being a first fractional value of the first cell current based on a first ratio of the first cell current to the first current, generating, with the second current mirror, a second current having a second current value, the second current value being a second fractional value of the second cell current based on a second ratio of the second cell current to the second current, and generating a voltage output based on a value of the third cell current and a sum of the first current value and the second current value.

In some embodiments, a memory array includes a first reference cell configured to output a first cell current corresponding to the first reference cell being programmed to a first logical value, a second reference cell configured to output a second cell current corresponding to the second reference cell being programmed to a second logical value different from the first logical value, a plurality of memory cells, a first selection circuit configured to select a memory cell of the plurality of memory cells, and a current generating circuit. The current generating circuit includes a first current mirror configured to generate a first current having a first current value corresponding to half a value of the first cell current, and a second current mirror configured to generate a second current having a second current value corresponding to half a value of the second cell current, wherein the current generating circuit is configured to generate a reference voltage having a reference voltage value based on the first current value and the second current value. The memory array also includes a sense amplifier configured to generate an output voltage value based on the reference voltage value and a value of a current of the selected memory cell of the plurality of memory cells.

A number of embodiments have been described. It will nevertheless be understood that various modifications may be made without departing from the spirit and scope of the disclosure. For example, various transistors being shown as a particular dopant type (e.g., N-type or P-type Metal Oxide Semiconductor (NMOS or PMOS)) are for illustration purposes. Embodiments of the disclosure are not limited to a particular type. Selecting different dopant types for a particular transistor is within the scope of various embodiments. The low or high logical value of various signals used in the above description is also for illustration. Various embodiments are not limited to a particular logical value when a signal is activated and/or deactivated. Selecting different logical values is within the scope of various embodiments. In various embodiments, a transistor functions as a switch. A switching circuit used in place of a transistor is within the scope of various embodiments. In various embodiments, a source of a transistor can be configured as a drain, and a drain can be configured as a source.

The above illustrations include exemplary operations, but the operations are not necessarily performed in the order shown. Operations may be added, replaced, changed order, and/or eliminated as appropriate, in accordance with the spirit and scope of disclosed embodiments.

What is claimed is:

1. A circuit comprising:
   a current generating circuit comprising:
      a first current mirror configured to generate a first current having a first current value, wherein
         the first current value is less than a value of a first cell current through a first reference cell and a first transistor having a gate terminal directly connected with a drain terminal, and
         the first current value is based on a first ratio of the first cell current to the first current; and
      a second current mirror configured to generate a second current having a second current value, wherein
         the second current value is less than a value of a second cell current through a second reference cell and a second transistor having a gate terminal directly connected with a drain terminal, and
         the second current value is based on a second ratio of the second cell current to the second current,
      wherein the current generating circuit is configured to generate a reference current having a reference current value based on the first current value and the second current value; and
   a sense amplifier configured to receive a third current having a third current value and generate a voltage output based on the reference current value and the third current value.

2. The circuit of claim 1, wherein
   the value of the first cell current corresponds to the first reference cell storing a first logical value, and
   the value of the second cell current corresponds to the second reference cell storing a second logical value different from the first logical value.

3. The circuit of claim 1, wherein at least one of
   the first current mirror comprises the first transistor having a first size and a third transistor having a second size, the first size being related to the second size by the corresponding first or
   the second current mirror comprises the second transistor having a third size and a fourth transistor having a fourth size, the third size being related to the fourth size by the second ratio.

4. The circuit of claim 1, wherein at least one of the first ratio or the second ratio is 2:1.

5. The circuit of claim 1, wherein the current generating circuit further comprises at least one stabilization circuit configured to stabilize one of the first cell current or the second cell current.

6. The circuit of claim 1, further comprising a memory cell configured to generate the third current,
   wherein
      the value of the first cell current corresponds to a first value of the third current when the memory cell stores a first logical value, and
      the value of the second cell current corresponds to a second value of the third current when the memory cell stores a second logical value different from the first logical value.

7. The circuit of claim 1, wherein the current generating circuit is configured to convert the reference current into a reference voltage.

8. The circuit of claim 7, wherein
   the sense amplifier is one sense amplifier of a plurality of sense amplifiers, and
   the circuit is configured to provide the reference voltage to each sense amplifier of the plurality of sense amplifiers.

9. A method comprising:
   providing a first cell current from a first reference cell to a first current mirror, wherein providing the first cell current comprises the first cell current flowing through a drain of a first transistor in the first current mirror, the drain of the first transistor being connected with a gate terminal of the first transistor;
   providing a second cell current from a second reference cell to a second current mirror, wherein providing the second cell current comprises the second cell current flowing through a drain of a second transistor in the second current mirror, the drain of the second transistor being connected with a gate terminal of the second transistor;
   generating a third cell current with a memory cell;
   generating, with the first current mirror, a first current having a first current value, the first current value being a first fractional value of the first cell current based on a first ratio of the first cell current to the first current;
   generating, with the second current mirror, a second current having a second current value, the second current value being a second fractional value of the second cell current based on a second ratio of the second cell current to the second current; and
   generating a voltage output based on a value of the third cell current and a sum of the first current value and the second current value.

10. The method of claim 9, wherein
    providing the value of the first cell current comprises storing a first logical value in the first reference cell, and
    providing the value of the second cell current comprises storing a second logical value in the second reference cell, the second logical value being different from the first logical value.

11. The method of claim 9, wherein at least one of
    generating the first current comprises using the first transistor having a first size and a third transistor having a second size, the first size being related to the second size by the first ratio, or
    generating the second current comprises using the second transistor having a third size and a fourth transistor having a fourth size, the third size being related to the fourth size by the second ratio.

12. The method of claim 9, wherein at least one of the first ratio or the second ratio is 2:1.

13. The method of claim 9, further comprising:
    selecting the memory cell from a plurality of memory cells; and
    selecting the first reference cell from a plurality of first reference cells and the second reference cell from a plurality of second reference cells, wherein each of selecting the first reference cell and selecting the second reference cell is based on the selection of the memory cell from the plurality of memory cells.

14. The method of claim 9, further comprising stabilizing at least one of the first cell current, the second cell current, or the third current.

15. A memory array comprising:
a first reference cell configured to output a first cell current corresponding to the first reference cell being programmed to a first logical value;
a second reference cell configured to output a second cell current corresponding to the second reference cell being programmed to a second logical value different from the first logical value;
a plurality of memory cells;
a first selection circuit configured to select a memory cell of the plurality of memory cells;
a current generating circuit comprising:
a first current mirror configured to generate a first current having a first current value corresponding to half a value of the first cell current; and
a second current mirror configured to generate a second current having a second current value corresponding to half a value of the second cell current,
wherein the current generating circuit is configured to generate a reference voltage having a reference voltage value based on the first current value and the second current value; and
a sense amplifier configured to generate an output voltage value based on the reference voltage value and a value of a current of the selected memory cell of the plurality of memory cells.

16. The memory array of claim 15, wherein at least one of the first current mirror or the second current mirror comprises a first transistor having a first size and a second transistor having a second size, the first size being related to the second size by a ratio of 2:1.

17. The memory array of claim 15, wherein
the first reference cell and the second reference cell are reference cells of a plurality of reference cells, and
the memory array further comprises a second selection circuit configured to select one of the first reference cell or the second reference cell of the plurality of reference cells.

18. The memory array of claim 15, wherein the current generating circuit is configured to generate the reference voltage from a reference current equal to a sum of the first current and the second current.

19. The memory array of claim 18, wherein the sense amplifier is configured to
mirror the reference current based on the reference voltage, and
compare a value of the mirrored reference current to the value of the current of the selected memory cell.

20. The memory array of claim 15, further comprising at least one of:
a first stabilization circuit configured to stabilize the first cell current;
a second stabilization circuit configured to stabilize the second cell current; or
a third stabilization circuit configured to stabilize the current of the selected memory cell.

* * * * *